United States Patent
Higo

(10) Patent No.: US 9,477,145 B2
(45) Date of Patent: Oct. 25, 2016

(54) LIGHT SOURCE DEVICE HAVING LASER LIGHT EMITTING ELEMENTS ADHESIVELY FIXED TO A LIGHT SOURCE ELEMENT HOLDER, PROJECTOR, AND LIGHT SOURCE DEVICE FABRICATION METHOD

(71) Applicant: CASIO COMPUTER CO., LTD., Tokyo (JP)

(72) Inventor: Tomio Higo, Akishima (JP)

(73) Assignee: CASIO COMPUTER CO., LTD., Tokyo (JP)

(*) Notice: Subject to any disclaimer, the term of this patent is extended or adjusted under 35 U.S.C. 154(b) by 1071 days.

(21) Appl. No.: 13/623,339

(22) Filed: Sep. 20, 2012

(65) Prior Publication Data
US 2013/0070215 A1 Mar. 21, 2013

(30) Foreign Application Priority Data
Sep. 20, 2011 (JP) ................. 2011-204429

(51) Int. Cl.
H01S 5/022 (2006.01)
G03B 21/20 (2006.01)
H01S 5/02 (2006.01)

(52) U.S. Cl.
CPC ......... G03B 21/204 (2013.01); G03B 21/2066 (2013.01); G03B 21/2093 (2013.01);
(Continued)

(58) Field of Classification Search
CPC .. H01S 5/02212; H01S 5/02288; H01S 5/02; H01S 5/0226; H01S 5/0256; H01S 5/02276
See application file for complete search history.

(56) References Cited

U.S. PATENT DOCUMENTS 4,697,880 A * 10/1987 Angerstein .......... G02B 6/4204
359/641

5,285,462 A * 2/1994 Kasahara ........... H01S 5/02212
257/659
(Continued)

FOREIGN PATENT DOCUMENTS

| CN | 102052608 A | 5/2011 |
|----|-------------|--------|
| JP | 02022515 U  | 2/1990 |

(Continued)

OTHER PUBLICATIONS

Japanese Office Action (and English translation thereof) dated Jun. 4, 2015, issued in counterpart Japanese Application No. 2011-204429.

(Continued)

*Primary Examiner* — Bao-Luan Le
(74) *Attorney, Agent, or Firm* — Holtz, Holtz & Volek PC

(57) ABSTRACT

A light source device has a laser light emitting element including a cylinder portion, a flange portion and lead wire terminals, a collimator lens, a collimator lens holder including a collimator lens mounting depressed portion and a hole portion communicating with the depressed portion and accommodating the cylinder portion, and a light source element holder holding the laser light emitting element and including a lead wire outlet hole portion accommodating the lead wire terminals and penetrating from a front surface to a rear surface, and a front surface of the flange portion is fastened by the perimeter of a rear end of the hole portion to press the laser light emitting element against the front surface of the light source element holder to thereby fix the laser light emitting element to the light source element holder, an adhesion fixing member being filled in the lead wire outlet hole portion.

18 Claims, 9 Drawing Sheets

(52) U.S. Cl.
CPC .............. *H01S 5/02* (2013.01); *H01S 5/0226* (2013.01); *H01S 5/02212* (2013.01); *H01S 5/02256* (2013.01); *H01S 5/02276* (2013.01); *H01S 5/02288* (2013.01); *Y10T 29/4978* (2015.01)

(56) References Cited

U.S. PATENT DOCUMENTS

| | | | | |
|---|---|---|---|---|
| 5,878,073 | A * | 3/1999 | Wu | H01S 5/02212 359/829 |
| 6,097,749 | A * | 8/2000 | Naoe | G02B 5/22 372/101 |
| 6,343,092 | B1 * | 1/2002 | Naoe | G02B 5/22 372/100 |
| 6,351,483 | B1 * | 2/2002 | Chen | G01B 11/27 250/397 |
| 6,928,100 | B2 * | 8/2005 | Sato | G02B 7/025 359/718 |
| 7,088,750 | B2 * | 8/2006 | Wu | H01S 5/02288 372/101 |
| 7,457,342 | B2 * | 11/2008 | Shyu | G02B 7/025 372/101 |
| 7,680,161 | B2 * | 3/2010 | Takahashi | H01S 5/02212 257/678 |
| 7,967,452 | B2 * | 6/2011 | Itoh | G03B 21/14 353/119 |
| 8,414,730 | B2 * | 4/2013 | Matsuura | B41J 2/471 156/272.2 |
| 8,724,668 | B2 | 5/2014 | Yabe et al. | |
| 8,789,982 | B2 * | 7/2014 | Matsuura | B41J 2/471 362/311.01 |
| 8,960,974 | B2 * | 2/2015 | Yabe | H01S 5/02 362/227 |
| 2005/0123010 | A1 * | 6/2005 | Wu | H01S 5/02288 372/29.022 |
| 2009/0296399 | A1 * | 12/2009 | Matsuura | B41J 2/471 362/257 |
| 2011/0096542 | A1 * | 4/2011 | Yabe | H01S 5/02 362/235 |
| 2012/0038892 | A1 * | 2/2012 | Kurtz | H04N 9/3105 353/31 |
| 2013/0188363 | A1 * | 7/2013 | Matsuura | B41J 2/471 362/311.01 |

FOREIGN PATENT DOCUMENTS

| | | |
|---|---|---|
| JP | 03066150 U | 6/1991 |
| JP | 03106614 U | 11/1991 |
| JP | 2006147744 A | 6/2006 |
| JP | 2007023916 A | 2/2007 |
| JP | 2009-246040 A | 10/2009 |
| JP | 2011134668 A | 7/2011 |
| JP | 2011134669 A | 7/2011 |
| WO | 2007023916 A1 | 3/2007 |

OTHER PUBLICATIONS

Chinese Office Action dated Aug. 4, 2014, issued in counterpart Chinese Application No. 201210352482.8.

Japanese Office Action (and English translation thereof) dated Nov. 5, 2015, issued in counterpart Japanese Application No. 2011-204429.

* cited by examiner

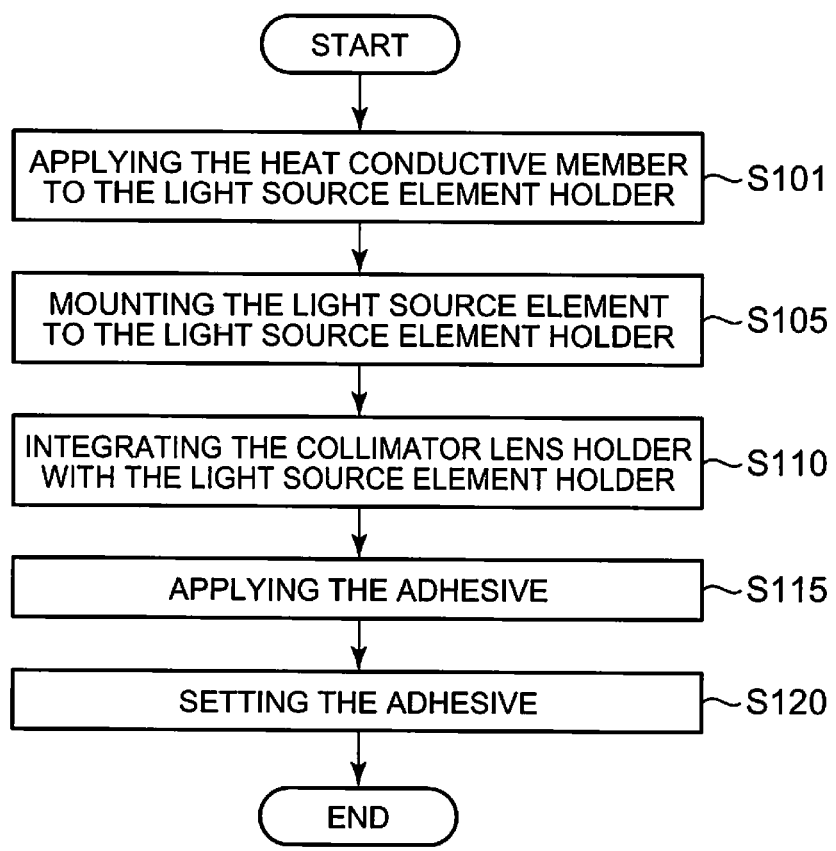

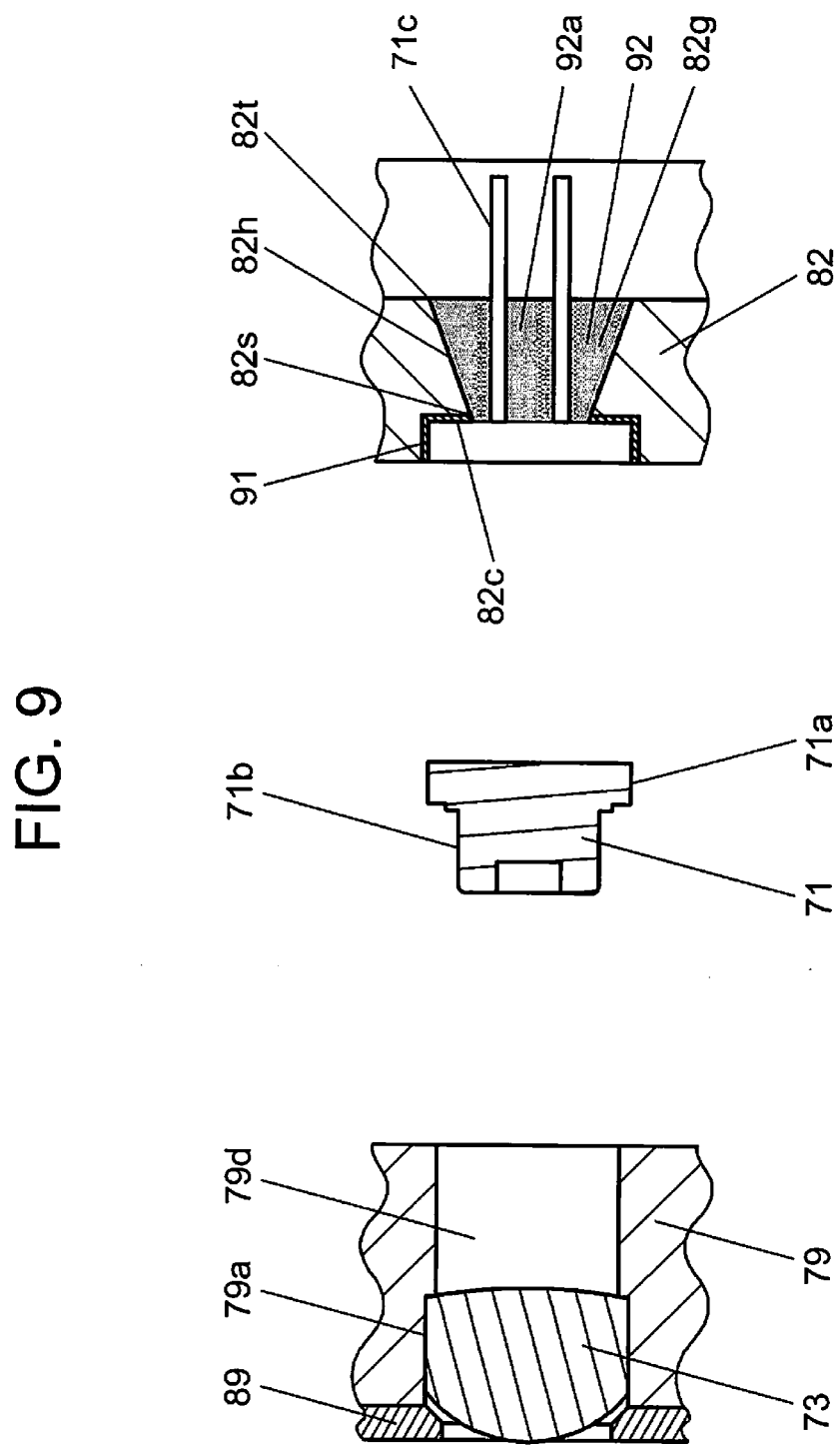

LIGHT SOURCE DEVICE HAVING LASER LIGHT EMITTING ELEMENTS ADHESIVELY FIXED TO A LIGHT SOURCE ELEMENT HOLDER, PROJECTOR, AND LIGHT SOURCE DEVICE FABRICATION METHOD

CROSS-REFERENCE TO RELATED APPLICATIONS

This application is based upon and claims the benefit of priority under 35 USC 119 of Japanese Patent Application No. 2011-204429 filed on Sep. 20, 2011, the entire contents of which, including the description, claims, drawings and abstract, are incorporated herein by reference.

BACKGROUND OF THE INVENTION

1. Field of the Invention

The present invention relates to a light source device, a projector and a light source device fabrication method.

2. Description of the Related Art

In these days, data projectors are used on many occasions as image projection units which project images including images on a screen of a personal computer and video images, as well as images based on image data which are stored in a memory card on to a screen. In these projectors, light emitted from a light source is collected on to a micromirror display element called a digital micromirror device (DMD) or a liquid crystal panel for projection of color images on to a screen.

Conventionally, the mainstream of these projectors has been those which utilize a high-intensity discharge lamp as a light source. In recent years, however, there have been made many developments on various types of projectors which use light emitting diodes or laser diodes, or organic electroluminescent materials or phosphors as light sources.

Then, Japanese Unexamined Patent Application No. 2009-246040 (JP-A-2009-246040) describes a laser light source device that has a holder which is a light source element holder which holds semiconductor laser diodes which are inserted into through holes formed therein and a base which is a lens holder which holds optical elements which are inserted into through holes formed therein. In this laser light source, the holder as a light source element holder has an inner circumference convex portion and an outer circumference concave portion and the holder and the base are fastened each other by an adhesive which is injected into a space between the inner circumference convex portion and the outer circumference concave portion which are formed in the holder in such a state that an upper surface of the inner circumference convex portion of the holder and one end surface of the base are closely attached each other.

BRIEF SUMMARY OF THE INVENTION

However, with the laser light source device described in JP-A-2009-246060, there is a problem inherent therein. Namely, there are fears that the light source elements such as the semiconductor laser light emitting elements are removed from the inside of the light source device intentionally for use for other applications or a person who attempts to remove the laser light source elements is erroneously hit by a laser beam.

Then, the present invention has been made in view of these situations and an object thereof is to provide a light source device that can solve the problem, a projector that employs the light source device and a fabrication method of the light source device.

With a view to attaining the object, according to a first aspect of the invention, there is provided a light source device comprising:

a laser light emitting element including a cylinder portion, a flange portion that projects outwards of the cylinder portion from a circumferential edge of a rear end of the cylinder portion and lead wire terminals that extend from a rear end face of the flange portion;

a collimator lens that makes light emitted from the laser light emitting element into parallel light;

a collimator lens holder including a lens mounting depressed portion that holds the collimator lens and a hole portion that communicates with the lens mounting depressed portion and which accommodates therein the cylinder portion; and a light source element holder that holds the laser light emitting element in a predetermined position on a front surface thereof and which includes a lead wire outlet hole portion that accommodates the lead wire terminals and which penetrates the light source element holder from the front surface to a rear surface thereof, wherein a front surface of the flange portion is fastened by the perimeter of a rear end of the hole portion so as to press the laser light emitting element against the front surface of the light source element holder to thereby fix the laser light emitting element to the light source element holder, and wherein an adhesion fixing member is filled in the lead wire outlet hole portion so that the laser light emitting element is adhesion fixed to the light source element holder.

According to a second aspect of the invention, there is provided a projector including light source devices, a display element, a light source side optical system that guides light from the light source devices to the display element, a projection side optical system that projects an image that is emitted from the display element on to a screen, and a projector control unit for controlling the light source devices and the display element, wherein the light source devices are a light source device that emits light of red wavelength band, a light source device that emits light of blue wavelength band and a light source device that emits light of green wavelength band, at least one of the light source devices being the light source device according to the invention.

According to a third aspect of the invention, there is provided a fabrication method of a light source device comprising:

a laser light emitting element including a cylinder portion, a flange portion that projects outwards of the cylinder portion from a circumferential edge of a rear end of the cylinder portion and lead wire terminals that extend from a rear end face of the flange portion;

a collimator lens that makes light emitted from the laser light emitting element into parallel light;

a collimator lens holder including a lens mounting depressed portion that holds the collimator lens and a hole portion that communicates with the lens mounting depressed portion and which accommodates therein the cylinder portion of the laser light emitting element; and a light source element holder including a lead wire outlet hole portion that accommodates the lead wire terminals of the laser light emitting element and which penetrates the light source element holder from the front surface to a rear surface thereof, wherein a front surface of the flange portion of the laser light emitting element is fastened by the perimeter of a rear end of the hole portion in the collimator lens holder so as to press the laser light emitting element against the front surface of the light source element holder to thereby fix the laser light emitting element to the light source element holder, and wherein an adhesion fixing member is filled in the lead wire outlet hole portion so that the laser light emitting element is adhesion fixed to the light source element holder, the fabrication method including the steps of:

placing the laser light emitting element at the front surface of the light source element holder by inserting the lead wire terminals through the lead wire outlet hole portion;

aligning the collimator lens holder with the light source element holder with the hole portion of the collimator lens holder aligned with the position of the laser light emitting element and fixedly joining the collimator lens holder and the light source element holder together; and thereafter filling the adhesion fixing member in the lead wire outlet hole portion with the rear surface of the light source element holder oriented upwards.

Advantages of the invention will be set forth in the description that follows, and in part will be obvious from the description, or may be learned by practice of the invention. Advantages of invention may be realized and obtained by means of the instrumentalities and combinations particularly pointed out hereinafter.

BRIEF DESCRIPTION OF THE DRAWINGS

The accompanying drawings, which are incorporated in and constitute part of the specification, illustrate an embodiment of the invention and serve to explain the principles of the invention, together with the general description given above and the detailed description of the embodiment given below.

FIG. 6 is a flowchart showing an example of a fabrication method of the light source device according to the embodiment of the invention.

FIG. 9 is a diagram showing an example in which an excitation light source that is a light source element is removed forcefully from the light source device according to the embodiment of the invention by applying excessive force.

DETAILED DESCRIPTION OF THE PREFERRED EMBODIMENT

An embodiment of the present invention will be described by reference to the accompanying drawings.

Figure 1:
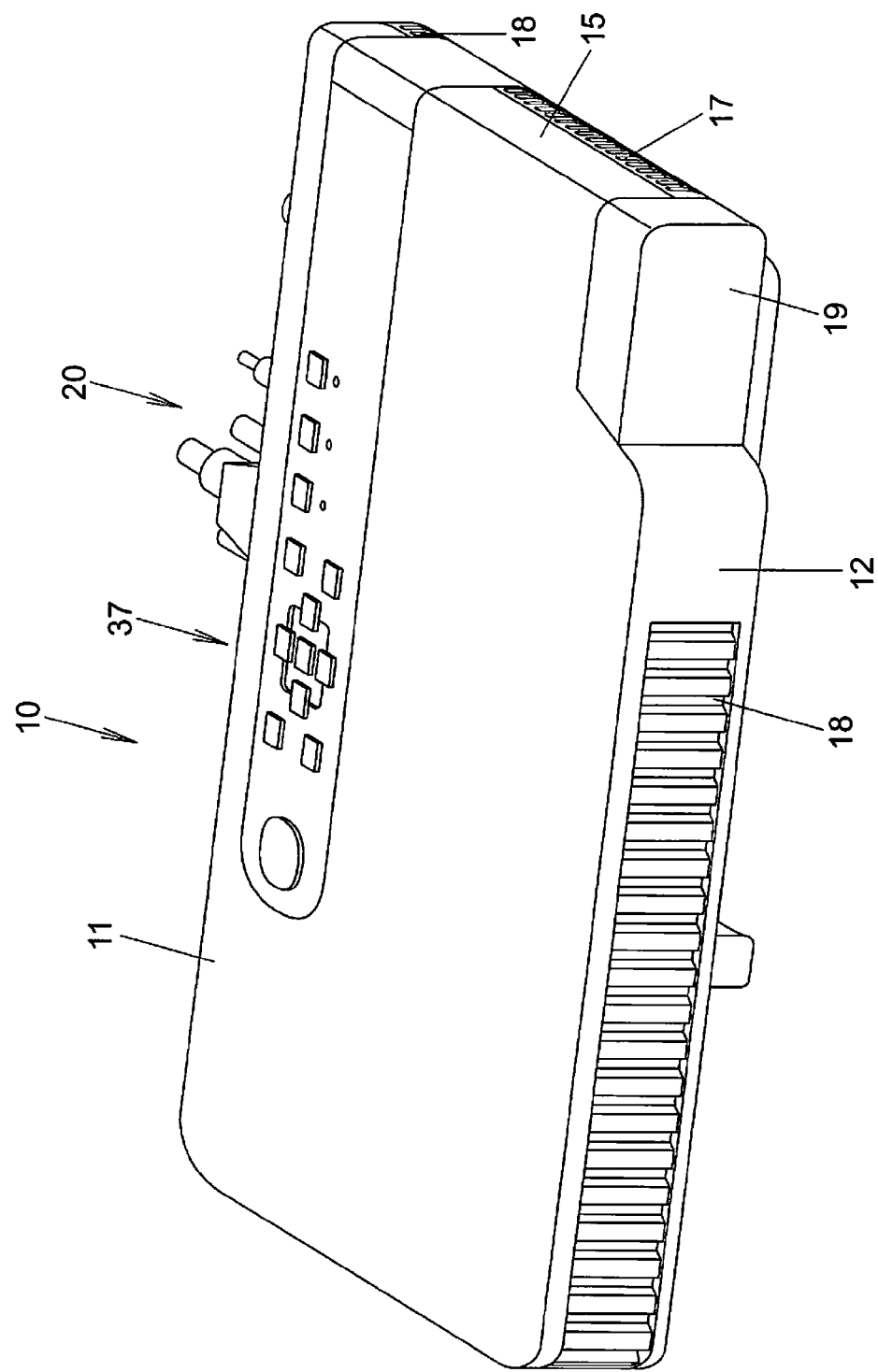
FIG. 1 is a perspective view showing an external appearance of a projector according to an embodiment of the invention.

Hereinafter, an embodiment of the invention will be described. FIG. 1 is a perspective view showing an external appearance of a projector 10. It should be noted that in this embodiment, when referred to with respect to the projector 10 herein, left and right denote left and right directions, respectively, with respect to the projecting direction of the projector 10, and front and rear denote front and rear directions, respectively, with respect to a direction of the projector 10 towards a screen and a traveling direction of a pencil of light.

Additionally, as is shown in FIG. 1, the projector 10 has a substantially rectangular parallelepiped shape and has a lens cover 19 which covers a projection opening which is laid to a side of a front side panel 12 which is referred to as a front side panel of a projector casing. Additionally, a plurality of outside air inlet ports 18 are formed in the front side panel 12. Further, although not shown, the projector 10 includes an Ir reception unit which receives a control signal from a remote controller.

In addition, a keys/indicators unit 37 is provided on an upper side panel 11 of the projector casing. Disposed on this keys/indicators unit 37 are keys and indicators which include a power supply switch key, a power indicator which informs whether the power supply is on or off, a projection switch key which switches on or off the projection by the projector, and an overheat indicator which informs of an overheat condition when a light source unit, a display element, a control circuit or the like overheats.

Further, provided on a back side or a back side panel of the projector casing are an input/output connector unit where USB terminals, an image signal input D-SUB terminal, an S terminal, an RCA terminal and the like are provided and various types of terminals 20 including a power supply adaptor plug. Additionally, a plurality of outside air inlet ports are formed in the back side panel. In addition, pluralities of inside air outlet ports 17 are respectively formed in a right side panel which is a lateral side panel of the projector casing which is not shown and a left side panel 15 which is a lateral side panel shown in FIG. 1. Further, outside air inlet ports 18 are also formed in a position on the left side panel 15 which lies near a corner portion defined between the left side panel 15 and the back side panel.

Figure 2:
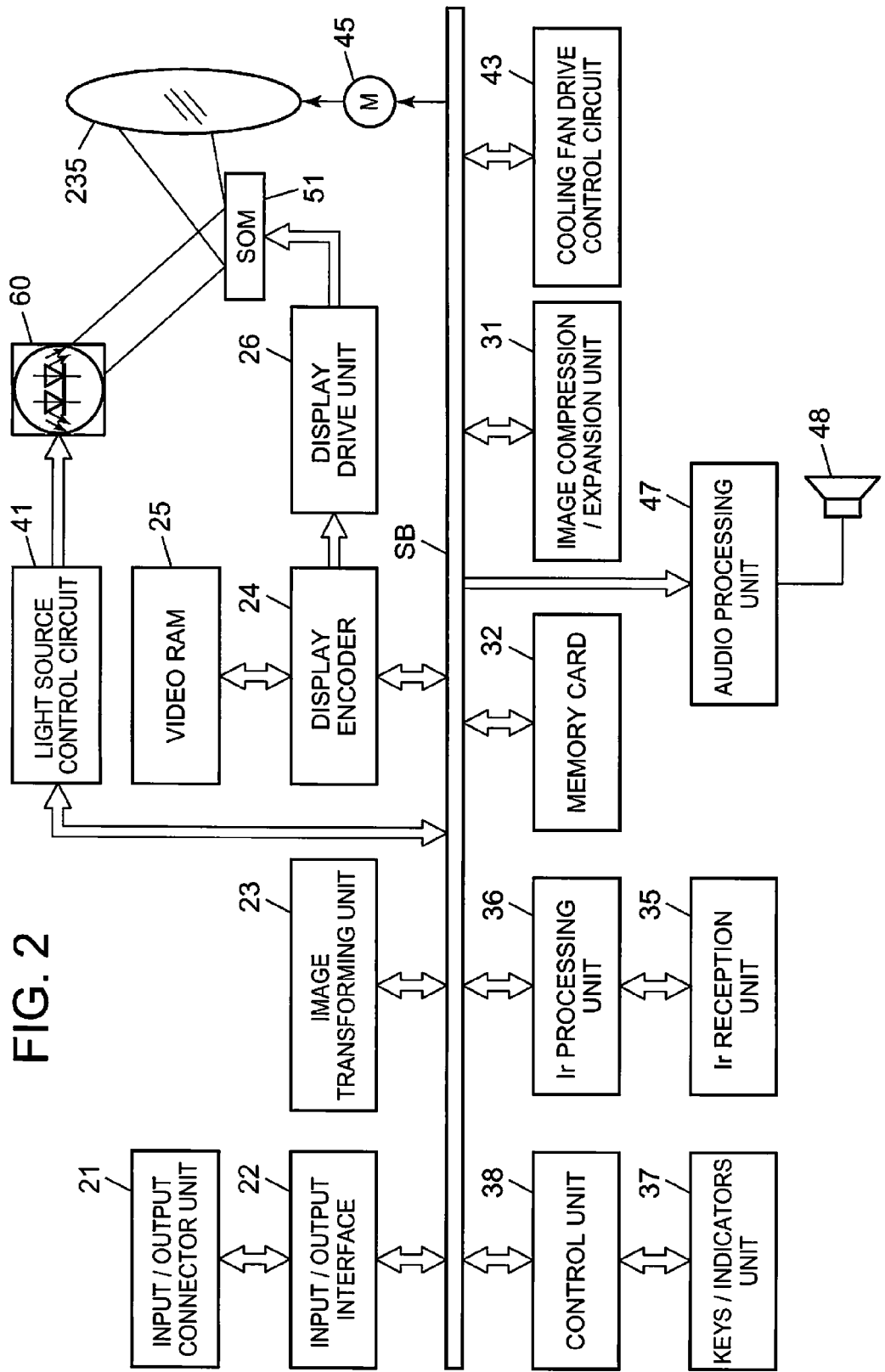
FIG. 2 is a functional block diagram of the projector according to the embodiment of the invention.

Next, a projector control unit of the projector 10 will be described by use of a functional block diagram shown in FIG. 2. The projector control unit includes a control unit 38, an input/output interface 22, an image transforming unit 23, a display encoder 24, a display drive unit 26 and the like.

The control unit 38 governs the control of respective operations of circuitries within the projector 10. Then, this control unit 38 is made up of a CPU, a ROM which stores in a fixed fashion operation programs of various types of settings and a RAM which is used as a working memory.

Image signals of various standards that are inputted from the input/output connector unit 21 are sent via the input/output interface 22 and a system bus (SB) to the image transforming unit 23 where the image signals are transformed so as to be unified into an image signal of a predetermined format which is suitable for display by the projector control unit. Thereafter, the image signals so transformed are outputted to the display encoder 24.

In addition, the display encoder 24 deploys the image signals that have been inputted thereinto on a video RAM 25 for storage therein and generates a video signal from the contents stored in the video RAM 25, outputting the video signal so generated to the display drive unit 26.

The display drive unit 26 functions as a display element control unit. The display drive unit 26 drives a display element 51 which is a spatial optical modulator (SOM) at an appropriate frame rate in response to the image signal outputted from the display encoder 24. Additionally, in this projector 10, a pencil of light which is emitted from a light source unit 60 is shone onto the display element 51 via a light guiding optical system. Then, an optical image is formed based on reflected light from the display element 51, and the image so formed is then projected on to a screen, not shown, for display thereon via a projection side optical system, which will be described later. In addition, a movable lens group 235 of this projection side optical system is driven by a lens motor 45 for zooming or focusing.

Additionally, an image compression/expansion unit 31 executes a recording process in which a luminance signal and a color difference signal of an image signal are data compressed through processes such as ADCT and Huffman coding, and the compressed data is sequentially written onto a memory card 32 which is configured as a detachable recording medium.

Further, when in a reproducing mode, the image compression/expansion unit 31 reads out the image data which is recorded on the memory card 32 and expands individual image data which make up a series of dynamic images frame by frame. Then, the image data is outputted to the display encoder 24 via the image transforming unit 23 so as to enable the display of dynamic images based on the image data stored on the memory card 32.

Operation signals generated at the keys/indicators unit 37 which is made up of the main keys and indicators provided on the upper side panel 11 of the projector casing are sent out directly to the control unit 38. Key operation signals from the remote controller are received by the Ir reception unit 35, and a code signal which is demodulated at an Ir processing unit 36 is outputted to the control unit 38.

In addition, an audio processing unit 47 is connected to the control unit 38 via the system bus (SB). This audio processing unit 47 includes a circuitry for a sound source such as a PCM sound source. When in a projection mode and a reproducing mode, the audio processing unit 47 converts audio data into analog signals and drives a loudspeaker 48 to radiate loudly sound or voice based on the audio data.

In addition, the control unit 38 controls a light source control circuit 41 which is configured as alight source control unit. This light source control circuit 41 controls individually the emission of light of an excitation light shining device, a red light source device and a blue light source device of the light source unit 60 so that light of a predetermined wavelength band that is required when an image is generated can be emitted from the light source unit 60.

Further, the control unit 38 causes a cooling fan drive control circuit 43 to detect temperatures through a plurality of temperature sensors which are provided in the light source unit 60, and then causes the cooling fan drive control circuit 43 to control the rotating speeds of cooling fans based on the results of the temperature detection. Additionally, depending upon the results of the temperature detection by the temperature sensors, the control unit 38 also controls the cooling fan drive control circuit 43 to cut off the power supply to a projector main body. Further, the control unit 38 also causes the cooling fan drive control circuit 43 to make the cooling fans continue to rotate by use of a timer or the like even after the power supply to the projector main body is cut off.

Figure 3:
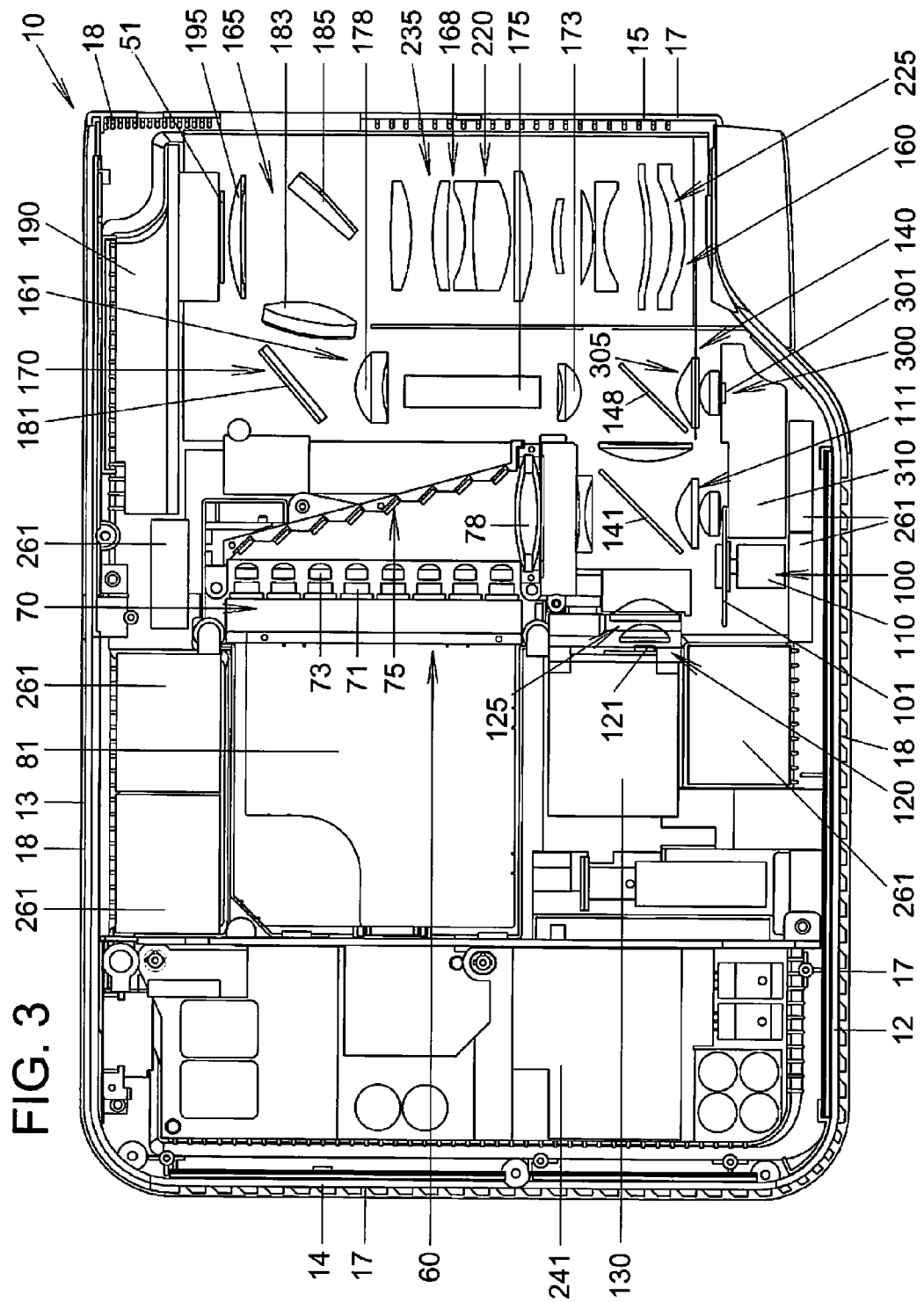
FIG. 3 is an exemplary plan view showing an internal construction of the projector according to the embodiment of the invention.

Next, an internal construction of the projector 10 will be described. FIG. 3 is an exemplary plan view showing an internal construction of the projector 10. As shown in FIG. 3, the projector 10 includes a control circuit board 241 in the vicinity of the right side panel 14. This control circuit board 241 includes a power supply circuit block, a light source control block and the like. Additionally, the projector 10 includes the light source unit 60 which is provided to a side of the control circuit board 241, that is, at a substantially central portion of the projector casing. Further, the projector 10 includes an optical system unit 160 between the light source unit 60 and the left side panel 15.

The light source unit 60 includes an excitation light shining device 70 which is a light source device that is disposed at a substantially transversely central portion of the projector casing and in the vicinity of the back side panel 13. Additionally, the light source unit 60 includes a luminescent light emitting device 100 that is disposed on an optical axis of a pencil of light which is emitted from the excitation light shining device 70 and in the vicinity of the front side panel 12. Further, the light source unit 60 includes a blue light source device 300 that is disposed in the vicinity of the front side panel 12 so as to be parallel to a pencil of light which is emitted from the luminescent light emitting device 100. Furthermore, the light source unit 60 includes a red light source device 120 that is disposed between the excitation light shining device 70 and the luminescent light emitting device 100. Additionally, the light source unit 60 includes a light guiding optical system 140 that turns the directions of optical axes of light which is emitted from the luminescent light emitting device 100, light which is emitted from the red light source device 120 and light which is emitted from the blue light source device 300 so as to be collected into the same optical axis so that the light beams of the respective colors are guided to an entrance port of a light tunnel 175 which constitutes a predetermined plane.

The excitation light shining device 70 includes excitation light sources 71. These excitation light sources 71 are light source elements such as laser light emitting elements which are disposed so that optical axes thereof are parallel to the back side panel 13. Additionally, the excitation light shining device 70 includes a group of reflection mirrors 75 which each turn an optical axis of light emitted from each of the excitation light sources 71 by 90 degrees in the direction of the front side panel 12. Further, the excitation light shining device 70 includes a collective lens 78 which collects light emitted from the excitation light sources 71 and reflected by the group of reflection mirrors 75. Furthermore, the excitation light shining device 70 includes a heat sink 81 which is disposed between the excitation light sources 71 and the right side panel 14.

The excitation light sources 71 are such that in total 24 blue laser diodes are arranged into a matrix of three rows and eight columns. Collimator lenses 73 are disposed individually on respective optical axes of the blue laser diodes. The collimator lenses 73 are each a lens which transforms light emitted from each of the blue laser diodes into parallel light. In addition, in the group of reflection mirrors 75, a plurality of reflection mirrors 75 are arranged into steps like steps of a staircase so as to reduce sectional areas of pencils of light which are emitted from the excitation light sources 71 in one direction for emission towards the collective lens 78.

Cooling fans 261 are disposed between the heat sink 81 and the backside panel 13. Then, the excitation light sources 71 are cooled by the cooling fans 261 and the heat sink 81. Further, a cooling fan 261 is also disposed between the group of reflecting mirrors 75 and the back side panel 13, whereby the group of reflecting mirrors 75 and the collective lens 78 are cooled by this cooling fan 261.

The luminescent light emitting device 100 is disposed so as to be parallel to the front side panel 12. The luminescent light emitting device 100 includes a luminescent wheel 101 which is disposed so as to be at right angle to an optical axis of light emitted from the excitation light shining device 70. Additionally, the luminescent light emitting device 100 includes a wheel motor 110 which rotationally drives the luminescent wheel 101. Further, the luminescent light emitting device 100 includes a group of collective lens 111 which collects pencils of light which are emitted from the luminescent wheel 101 in the direction of the back side panel 13.

Additionally, the luminescent wheel 101 is a disc-shaped metallic base. An annular luminescent light emitting area is formed on the luminescent wheel 101 as a depressed portion. This luminescent light emitting area emits luminescent light of green wavelength band by receiving light emitted from the excitation light sources 71 as excitation light. The luminescent wheel 101 functions as a luminescent plate which emits luminescent light by receiving the excitation light. In addition, a surface of aside of the luminescent wheel 101 that includes the luminescent light emitting area and which lies to face the excitation light sources 71 is mirror finished through silver deposition so as to be formed into a reflection surface which reflects light, and a layer of green luminescent material is laid on this mirror-finished surface.

Then, light that is emitted from the excitation light shining device 70 and which is shone on to the green luminescent material layer of the luminescent wheel 101 excites a green luminescent material on the green luminescent material layer. Pencils of luminescent light which are emitted in every direction from the green luminescent material so excited are then directed directly towards the excitation light sources 71 or are reflected on the reflection surface of the luminescent wheel 101 so as to be eventually directed towards the excitation light sources 71. In addition, light that is shone onto the metallic base without being absorbed by the luminescent material in the luminescent material layer is reflected by the reflection surface to thereby enter the luminescent material layer again so as to excite the luminescent material. Consequently, by configuring the surface of the depressed portion of the luminescent wheel 101 as the reflection surface, the utilization efficiency of excitation light that is emitted from the excitation light sources 71 can be enhanced, thereby making it possible to emit brighter light.

It should be noted that in the excitation light that is reflected on the reflection surface of the luminescent wheel 101 so as to be directed towards the luminescent material layer, excitation light emitted towards the excitation light sources 71 without being absorbed by the luminescent material passes through a first dichroic mirror 141, which will be described later, while the luminescent light is reflected by the first dichroic mirror 141. Because of this, there is no such situation that the excitation light is emitted to the outside of the light source unit 60. Additionally, a cooling fan 261 is disposed between the wheel motor 110 and the front side panel 12, whereby the luminescent wheel 101 is cooled by this cooling fan 261.

The red light source device 120 includes a red light source 121 which is disposed so that an optical axis thereof becomes parallel to those of the excitation light sources 71. Additionally, the red light source 120 includes a group of collective lens 125 which collects light that is emitted from the red light source 121. This red light source device 120 is disposed so that the optical axis thereof is at right angle to light that is emitted from the excitation light shining device 70 and light of green wavelength band that is emitted from the luminescent wheel 101. In addition, the red light source 121 is a red light emitting diode which is a semiconductor light emitting element which radiates light of red wavelength band. Further, the red light source device 120 includes a heat sink 130 which is disposed on a side of the red light source 121 which lies to face the right side panel 14. Then, a cooling fan 261 is disposed between the heat sink 130 and the front side panel 12, whereby the red light source 121 is cooled by this cooling fan 261.

The blue light source device 300 includes a blue light source 301 that is disposed so as to be parallel to an optical axis of light that is emitted from the luminescent light emitting device 100. This blue light source device 300 includes further a group of collective lenses 305 which collects light that is emitted from the blue light source 301. Additionally, this blue light source device 300 is disposed so that an optical axis thereof intersects light that is emitted from the red light source device 120. In addition, the blue light source 301 is a blue light emitting diode which is a semiconductor light emitting element that radiates light of blue wavelength band. Further, the blue light source device 300 includes a heat sink 310 which is disposed on a side thereof which faces the front side panel 12. A cooling fan 261 is additionally disposed between the heat sink 310 and the front side panel 12, whereby the blue light source 301 is cooled by this cooling fan 261.

The light guiding optical system 140 includes collective lenses which collect pencils of light of red, green and blue wavelength bands and dichroic mirrors which turn the directions of optical axes of the pencils of light of red, green and blue wavelength bands to direct them to the same optical axis. Specifically speaking, in the light guiding optical system 140, a first dichroic mirror 141 is disposed in a position where the optical axes of light of blue wavelength band which is emitted from the excitation light shining device 70 and light of green wavelength band which is emitted from the luminescent wheel 101 intersect the optical axis of light of red wavelength band which is emitted from the red light source device 120. This first dichroic mirror 141 transmits light of blue wavelength band and light of red wavelength band and reflects light of green wavelength band to turn the direction of the optical axis of the green light by 90 degrees in the direction of the left side panel 15.

In addition, in the light guiding optical system 140, a second dichroic mirror 148 is disposed in a position where the optical axis of light of blue wavelength band which is emitted from the blue light source device 300 intersects the optical axis of light of red wavelength band which is emitted from the red light source device 120. This second dichroic mirror 148 transmits light of blue wavelength band and reflects light of green and red wavelength bands by 90 degrees in the direction of the back side panel 13. Additionally, a collective lens is disposed between the first dichroic mirror 141 and the second dichroic mirror 148. Further, a collective lens 173 is disposed in the vicinity of the light tunnel 175. This collective lens 173 collects light source light to the entrance port of the light tunnel 175.

The optical system unit 160 includes an illumination side block 161 which is positioned to a left-hand side of the excitation light shining device 70. The optical system unit 160 additionally includes an image generating block 165 which is positioned in the vicinity of a position where the back side panel 13 intersects the left side panel 15. The optical system unit 160 includes further a projection side block 168 which is positioned between the light guiding optical system 140 and the left side panel 15. Thus, the optical system unit 160 is configured into a substantially U-shape by these three blocks.

The illumination side block 161 includes part of a light source side optical system 170 which guides light source light which is emitted from the light source unit 60 to the display element 51 that belongs to the image generating block 165. This light source side optical system 170 that belongs to the illumination side block 161 includes the light tunnel 175 which transforms a pencil of light which is emitted from the light source unit 60 into a pencil of light in which the intensity thereof is uniformly distributed, a collective lens 178 which collects light which is emitted from the light tunnel 175, and an optical axis turning mirror 181 which turns the direction of the optical axis of a pencil of light which is emitted from the light tunnel 175 in the direction of the image generating block 165.

The image generating block 165 has, as the light source side optical system 170, a collective lens 183 which collects the light source light which is reflected by the optical axis turning mirror 181 to the display element 51. The image generating block 165 additionally includes a shining mirror 185 which shines the pencil of light which has passed through the collective lens 183 to the display element 51 at a predetermined angle. The image generating block 165 includes further a DMD which is the display element 51. A heat sink 190 is disposed between the display element 51 and the back side panel 13 for cooling the display element 51. Thus, the display element 51 is cooled by this heat sink 190. Additionally, a condenser lens 195, which functions as part of a projection side optical system 220, is disposed in the vicinity of the front of the display element 51.

The projection side block 168 has a group of lenses of the projection side optical system 220 which projects the "on" light which is reflected on the display element 51 on to the screen. This projection side optical system 220 includes a group of fixed lenses 225 which is incorporated in a fixed lens barrel. The projection side block 168 includes further a group of movable lenses 235 which is incorporated in a movable lens barrel. Thus, being configured in this way, the projection side block 168 is made into a variable focus lens having a zooming function. In the projection side block 168, the group of movable lenses 235 is moved by a lens motor for zooming and focusing. It should be noted that the excitation light sources 71 of the light source device are totally 24 blue laser diodes which are arranged into the matrix of three rows and eight columns.

Figure 4:
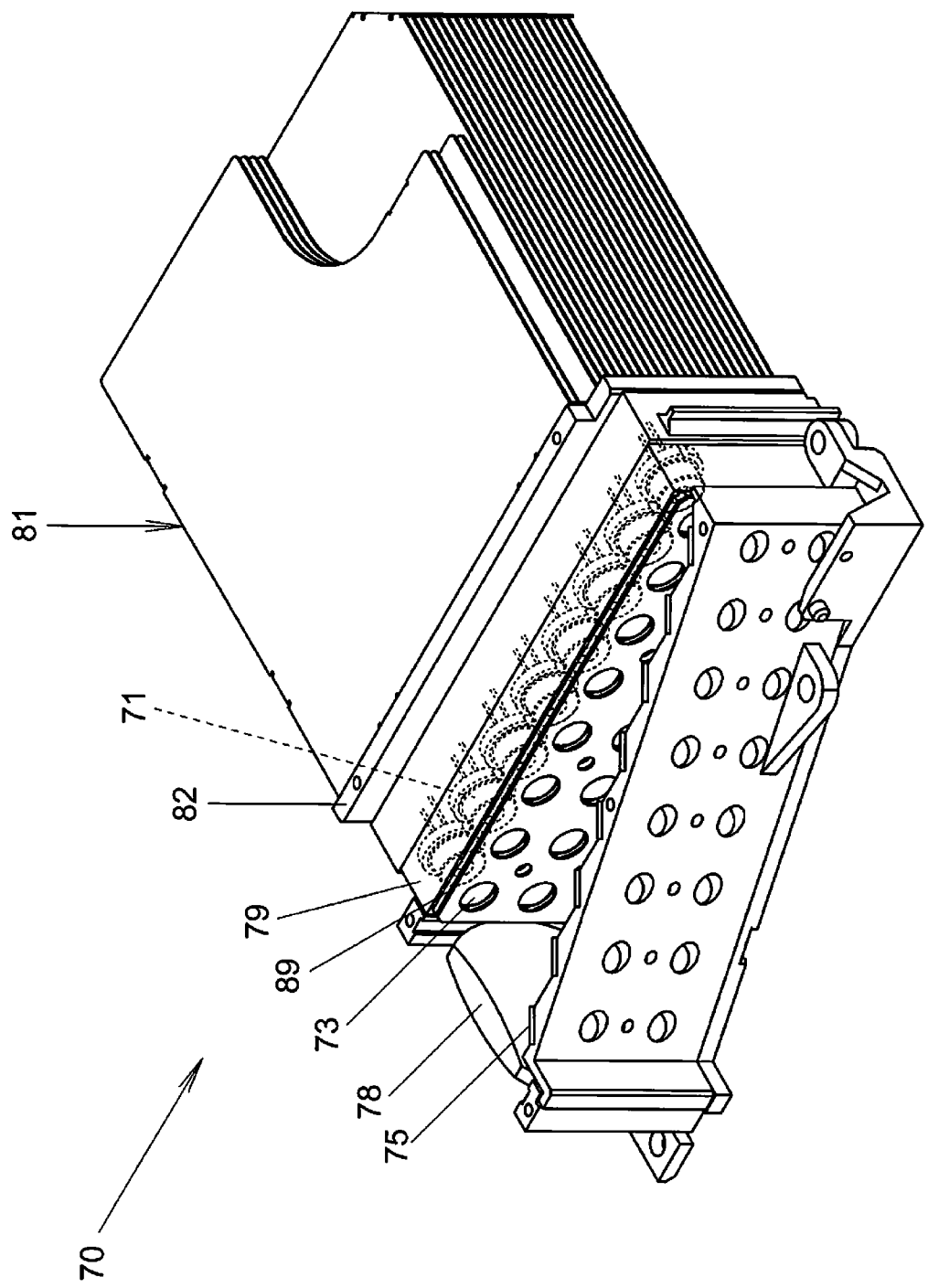
FIG. 4 is a perspective view of a light source device according to the embodiment of the invention.
Figure 5:
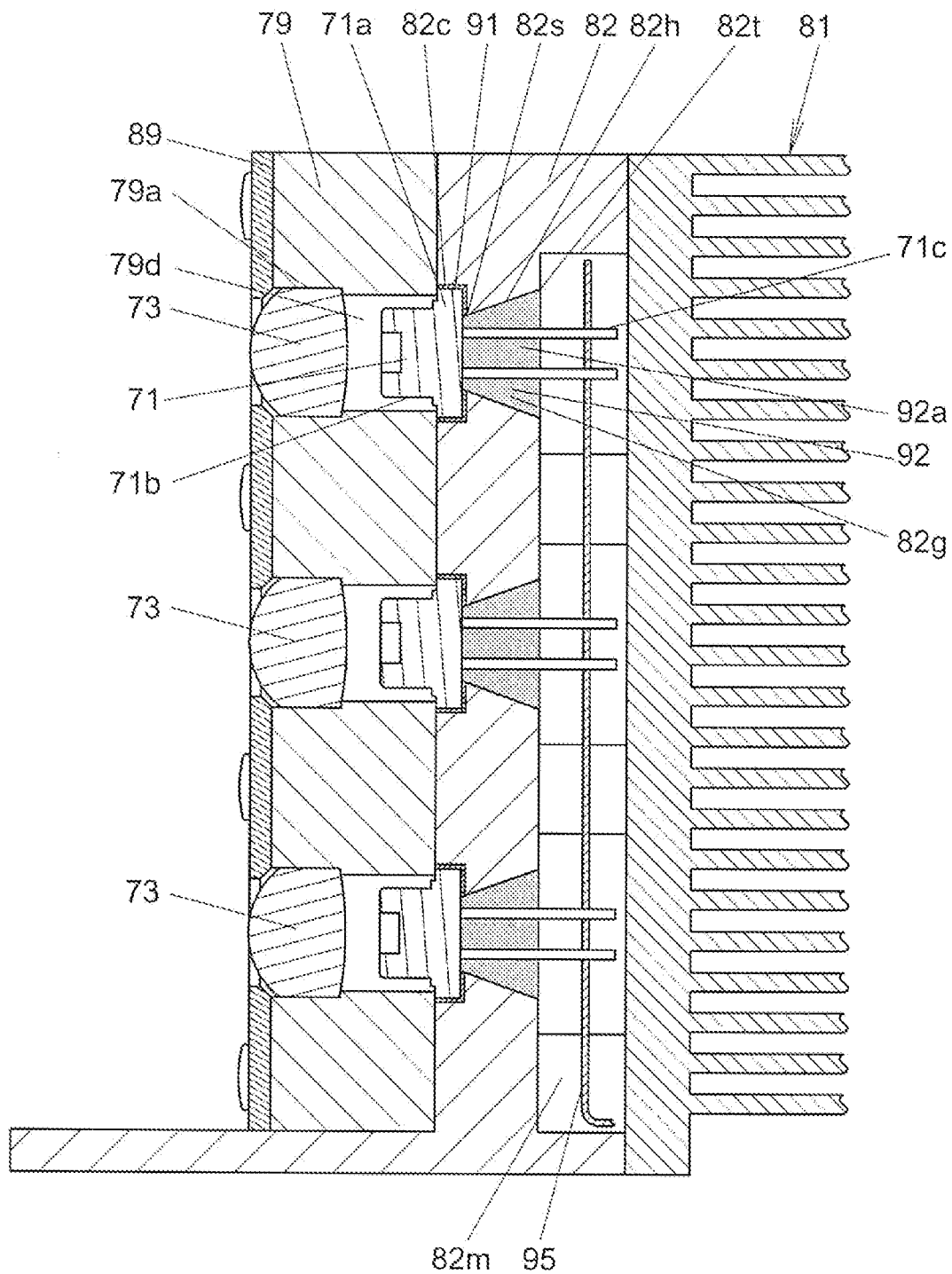
FIG. 5 is a sectional view of the light source device according to the embodiment of the invention.

Next, the excitation light shining device 70, which constitutes the light source device of the projector 10, will be described. FIG. 4 is a perspective view of the excitation light shining device 70 which is the light source device. FIG. 5 is a sectional view of the excitation light shining device 70. In this embodiment, when front and rear are referred to with respect to the excitation light shining device 70, the light emitting direction of the excitation light sources 71 denotes a front direction.

As shown in FIGS. 4, 5, the excitation light shining device 70 has the excitation light sources 71 which are laser light emitting diodes such as blue laser diodes, a light source element holder 82 in which the excitation light sources 71 are disposed, the collimator lenses 73 which are formed into a cylindrical shape, of which a light entrance side and a light exit side are formed into predetermined curved surfaces and which transform light emitted from the excitation light sources 71 into parallel light and a collimator lens holder 79 in which the collimator lenses 73 are disposed.

The excitation light source 71 has a flange portion 71a which projects outwards from a rear end of a cylinder portion 71b having a circular cylindrical shape and has further lead wire terminals 71c which extend from a rear end face of the flange portion 71a. It should be noted that this flange portion 71a is formed of metal and has a circular cylindrical shape, enabling heat to be dissipated therefrom.

The collimator lens holder 79 is a holding member which is made of a heat resistant hard resin and holds the collimator lenses 73 which collect light emitted from the excitation light sources 71. The collimator lens holder 79 has, at the front thereof, lens mounting depressed portions 79a to which the collimator lenses 73 are mounted and has, at the rear thereof, hole portions 79d that communicate with the lens mounting depressed portions 79a and which are formed larger in diameter than the cylinder portions 71b of the excitation light sources 71. The cylinder portions 71b of the excitation light sources are disposed individually in the hole portions 79d. Additionally, the perimeter of a rear end of the hole portion 79d in the collimator lens holder 79 is brought into contact with a front surface of the flange portion 71a of the excitation light source 71 so as to press a rear surface of the flange portion 71a against the light source element holder 82. It should be noted that while the collimator lens holder 79 is formed of the heat resistant hard resin in this embodiment, the collimator lens holder 79 may be formed of other materials having high heat resistance such as aluminum.

The light source element holder 82 is a heat dissipating member that is made of aluminum or the like and holds the excitation light sources 71. The light source element holder 82 has lead wire outlet hole portions 82g through which the lead wire terminals 71c of the excitation light sources 71 are inserted and element bearing depressed portions 82c which bear circumferential edges and the rear end faces of the flange portions 71a of the excitation light sources 71. It should be noted that in this embodiment, a front surface of the light source element holder 82 includes the element bearing depressed portions 82c.

A heat conductive member 91 such as a soft heat conductive grease is interposed between the flange portion 71a of the excitation light source 71 and the element bearing depressed portion 82c, so that heat generated in the excitation light source 71c can be dissipated to the light source element holder 82 by way of the heat conductive member 91.

The lead wire outlet hole portion 82g is formed concentrically with the element bearing depressed portion 82c. The lead wire outlet hole portion 82g is formed so that a diameter of a front opening portion 82s is smaller than a diameter of the element bearing depressed portion 82c. Additionally, the lead wire outlet hole portion 82g has an inverted tapered portion 82h in which a diameter of a rear opening portion 82t is larger than the diameter of the front opening portion 82s. In this embodiment, a sloping surface is formed as the inverted tapered portion 82h of the lead wire outlet hole portion 82g.

An adhesive 92 is filled and set in the inverted tapered portion 82h of the lead wire outlet hole portion 82g and is then set to form an adhesion fixing member 92a having a conical frustum shape so as to be brought into abutment with the rear end face of the flange portion 71a of the excitation light source 71. This adhesion fixing member 92a adhesion fixes the excitation light source 71 to the light source element holder 82. For example, a light-shone setting resin, a thermosetting resin or the like can be adopted as the adhesive 92.

A depressed flexible circuit board accommodating portion 82m is formed in the light source element holder 82 in a position further rearwards than the lead wire outlet hole portions 82g, and a flexible circuit board 95 is disposed in the flexible circuit board accommodating portion 82m. The lead wire terminals 71c of the excitation light sources 71 project to the rear from the adhesion fixing member 92a and are then electrically connected to the flexible circuit board 95 in the flexible circuit board accommodating portion 82m. The flexible circuit board 95 is electrically connected to the control circuit board 241 on which the control unit 38 is mounted. It should be noted that no adhesive 92 is filled in the flexible circuit board accommodating portion 82m.

Additionally, a thin metallic fastening plate 89 is provided on a front surface of the collimator lens holder 79 of the excitation light shining device 70 so as to hold the collimator lenses 73 which are properly positioned, and this fastening plate 89 is a lens fastening member for fastening the collimator lenses 73. This fastening plate 89 can suppress the movement of the collimator lenses 73 in the direction of the optical axes thereof so as to fix the collimator lenses 73 in an appropriate position in an ensured fashion. Light transmission holes are formed in the fastening plate 89 in positions which correspond individually to the collimator lenses 73.

In addition, the light source element holder 82 and the collimator lens holder 79 are fixed together with fixing members (not shown) such as screws so as to be integrated into a unit in such a state that the excitation light sources 71 are held therein.

Figure 7A:
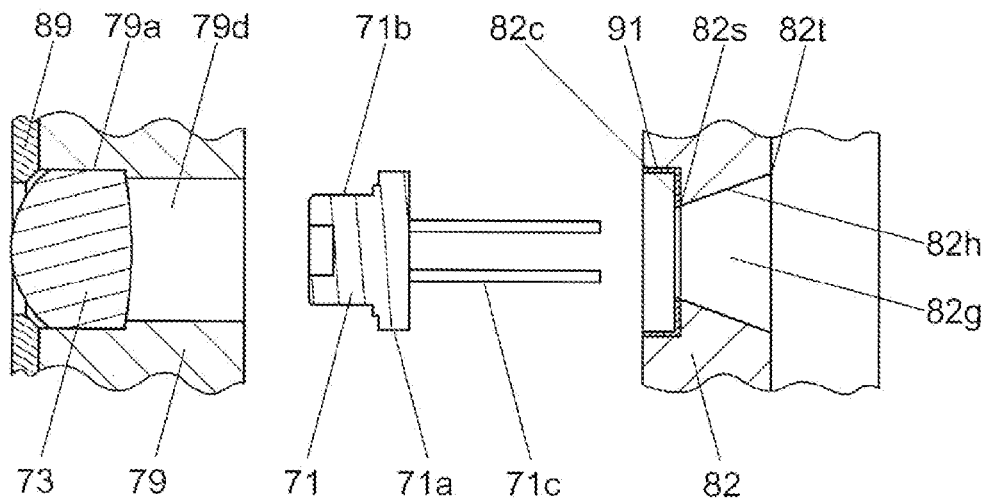
FIG. 7A is a diagram showing a first assembling step in fabrication of the light source device according to the embodiment of the invention.
Figure 7B:
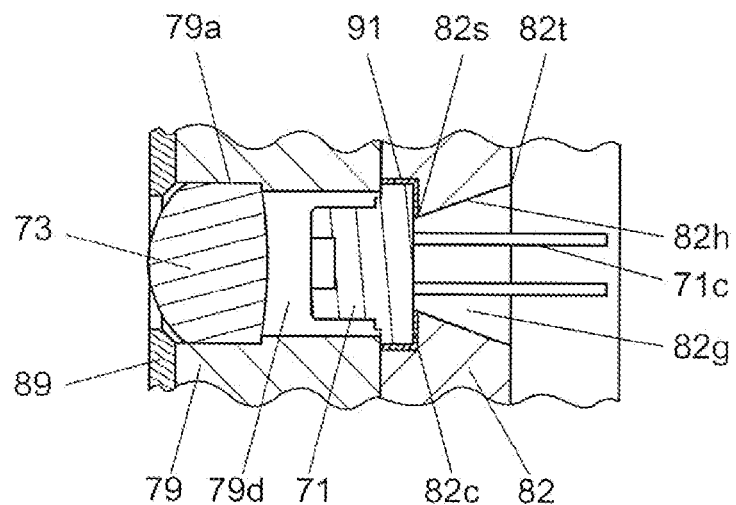
FIG. 7B is a diagram showing an assembling step that follows the step shown in FIG. 7A in fabrication of the light source device according to the embodiment of the invention.
Figure 7C:
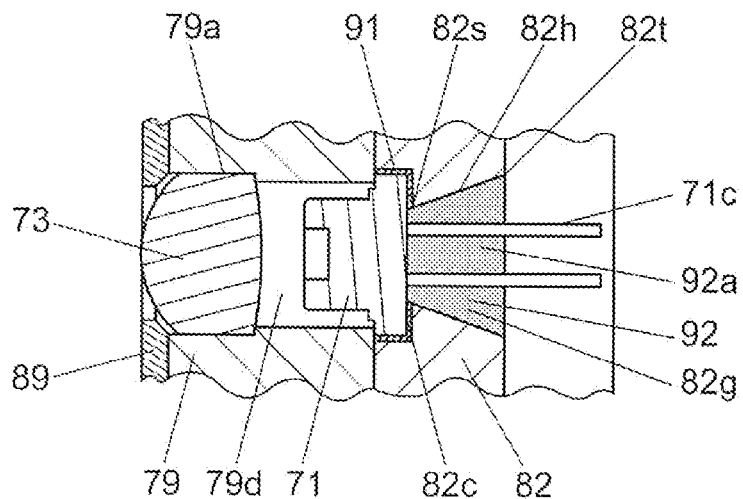
FIG. 7C is a diagram showing an assembling step that follows the step shown in FIG. 7B in fabrication of the light source device according to the embodiment of the invention.

Next, referring to the drawings, a fabrication method of the excitation light shining device 70 according to the embodiment of the invention will be described. FIG. 6 is a flowchart showing an example of a fabrication method of the excitation light shining device 70 which is the light source device. FIGS. 7A, 7B, 7C are diagrams showing an assembling order of the excitation light shining device 70.

As shown in FIG. 7A, the heat conductive member 91 such as a soft heat conductive grease is applied to the element bearing depressed portion 82c of the light source element holder 82 (step S101).

Next, as shown in FIG. 7B, the lead wire terminals 71c of the excitation light source 71 are inserted through the lead wire outlet hole portion 82g, and the circumferential edge of the rear end surface of the flange portion 71a of the excitation light source 71 is disposed in the element bearing depressed portion 82c of the light source element holder 82 (step S105). Then, the collimator lens holder 79 in which the collimator lenses 73 are disposed in the lens mounting depressed portions 79a is mounted on the light source element holder 82 (step S110). To describe this in detail, the perimeter of the rear end of the hole portion 79d in the collimator lens holder 79 is brought into contact with the front surface of the flange portion 71a of the excitation light source 71, so that the rear face of the flange portion 71a is pressed against the light source element holder 82. In this state, the light source element holder 82 and the collimator lens holder 79 are fixed together with the fixing members (not shown) such as screws so as to be integrated into a unit.

Next, as shown in FIG. 7C, the adhesive 92 is applied to be filled in the lead wire outlet hole portion 82g in the light source element holder 82. To describe this in detail, with a rear surface of the light source element holder 82 oriented upwards, the adhesive 92 is applied to be filled in the lead wire outlet hole portion 82g so as to be brought into abutment with the rear surface of the flange portion 71a of the excitation light source 71 (step S115). As this occurs, the adhesive 92 is applied to be filled in the lead wire outlet hole portion 82g up to the rear opening portion 82t from roots to end portions of the lead wire terminals 71c of the excitation light source 71.

Next, the adhesive 92 so filled is set (step S120). To describe this in detail, for example, the adhesive 92 so filled is left as it is only for a predetermined length of time so as to be set. Additionally, when an ultraviolet ray setting resin is adopted as the adhesive 92, light such as an ultraviolet ray is shone on to the adhesive 92 so as to be set. In addition, when a thermosetting resin is adopted as the adhesive 92, the adhesive 92 so filled is heated so as to be set. Further, when a two-part adhesive is used as the adhesive 92, a liquid mixture containing a main agent and a setting agent is applied and is then left as it is only for a predetermined length of time, so as to be set.

The adhesion fixing member 92a having the conical frustum shape is formed in the inverted tapered portion 82h in the lead wire outlet hole portion 82g by causing the adhesive 92 to be so set. Namely, the excitation light source 71 is adhesion fixed to the light source element holder 82 from a rear surface side thereof by the adhesion fixing member 92a.

Then, the lead wire terminals 71c of the excitation light source 71 and the flexible circuit board 95 are electrically connected to each other.

It should be noted that the description of a mounting step of the fastening plate 89 and an optical axis adjusting step of the collimator lens 73 and the excitation light source 71 will be omitted herein.

Figure 8:
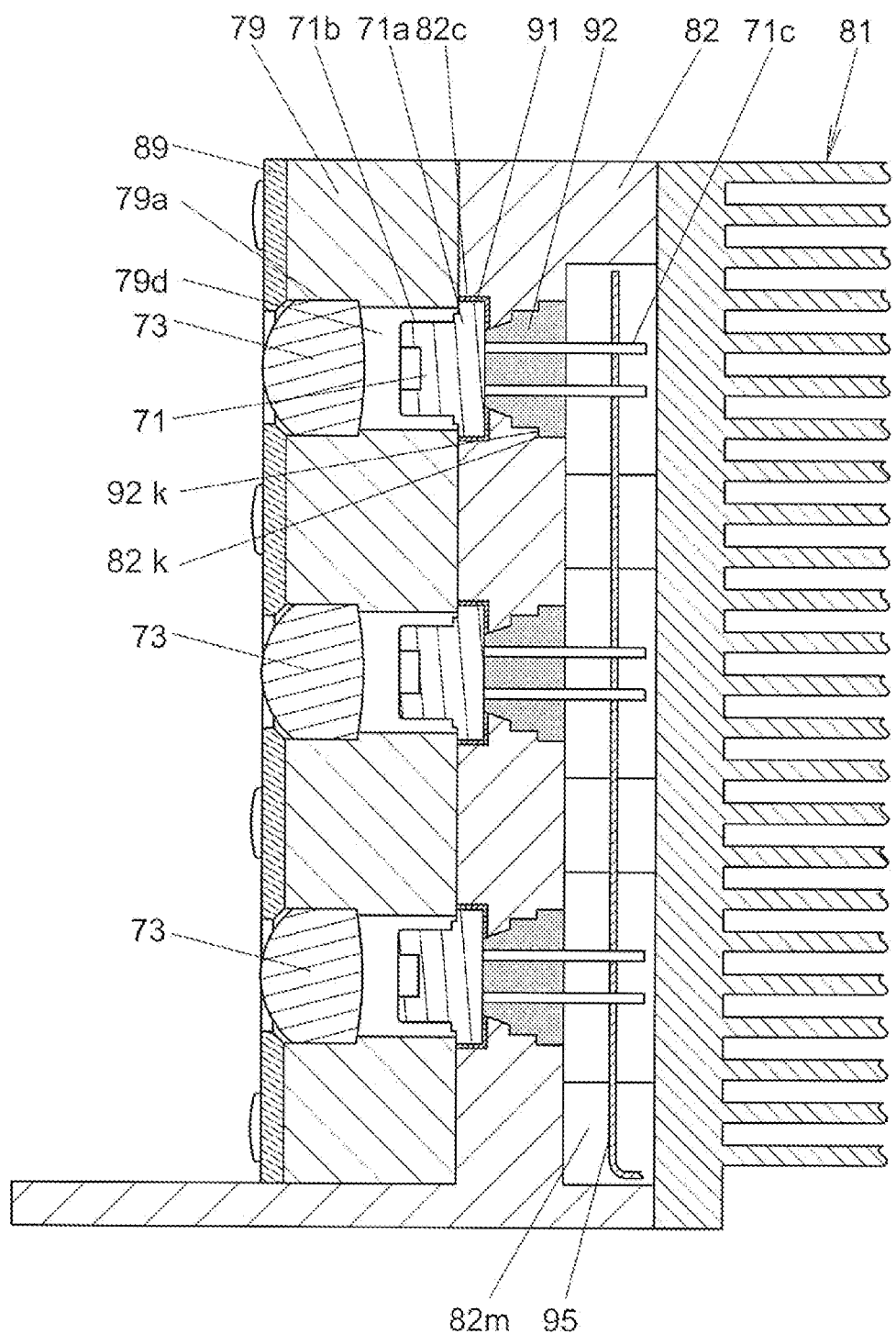
FIG. 8 is a sectional view of a light source device according to a modified example of the embodiment of the invention.

In the embodiment, while the lead wire outlet hole portion 82g of the light source element holder 82 has the inverted tapered portion 82h where the simple sloping surface is formed, the invention is not limited thereto. For example, as shown in FIG. 8, one or a plurality of step portions 82k may be formed on the inverted tapered portion 82h which constitutes a side surface of the lead wire outlet hole portion 82g. It should be noted that in this embodiment, the side surface of the lead wire outlet hole portion 82g includes the plurality of step portions 82k. As this occurs, the step portions 82k may be formed concentrically when seen from the rear of the light source device. Then, as shown in FIG. 8, the adhesion fixing member 92a comes to have projecting portions 92k which are formed by the adhesive 92 which is filled in the step portions 82k on the inverted tapered portion 82h. Because of this, when compared with the case where the adhesion fixing member 92a is formed in the inverted tapered portion where the simple sloping surface is formed, a surface area between the lead wire outlet hole portion 82g and the side surface of the adhesion fixing member 92a is increased, enhancing the adhesive force acting between the lead wire outlet hole portion 82g and the adhesion fixing member 92a.

In addition, a spiral groove portion may be formed on the side surface of the lead wire outlet hole portion 82g in the light source element holder 82 when seen from the rear of the light source device. It should be noted that in this embodiment, the side surface of the lead wire outlet hole portion 82g includes a plurality of spiral groove portions. As this occurs, the adhesion fixing member 92a comes to have projecting portions 92k which are formed by the adhesive 92 that is filled in the groove portions of the lead wire outlet hole portion 82g. Because of this, as has been described above, when compared with the case where the adhesion fixing member 92a is formed in the inverted tapered portion where the simple sloping surface is formed, a surface area between the lead wire outlet hole portion 82g and the side surface of the adhesion fixing member 92a is increased, enhancing the adhesive force acting between the lead wire outlet hole portion 82g and the adhesion fixing member 92a.

Additionally, minute irregularities may be formed on the side surface of the lead wire outlet hole portion 82g in the light source element holder 82. It should be noted that in this embodiment, the side surface of the lead wire outlet hole portion 82g includes minute irregularities. For example, minute irregularities are formed on a surface of the lead wire outlet hole portion 82g through a surface roughening process such as a sand blasting operation. Then, minute irregularities are formed on a surface of the adhesion fixing member 92a by the adhesive 92 which is filled in the minute irregularities on the lead wire outlet hole portion 82g and is then set. Namely, the adhesive force acting between the lead wire outlet hole portion 82g and the adhesion fixing member 92a is increased through the anchor effect.

In the embodiment, the element bearing depressed portions 82c are formed in the light source element holder 82, and the flange portions 71a of the excitation light sources 71 are mounted in those element bearing depressed portions 82c. However, the invention is not limited thereto. For example, in place of forming the element bearing depressed portions 82c in the light source element holder 82, depressed portions that correspond to the flange portions 71a of the excitation light sources 71 may be formed in the collimator lens holder 79. These depressed portions are formed so that axes thereof coincide with axes of the hole portions 79d. As this occurs, lead wire outlet hole portions 82g having a bore diameter that is smaller than the outside diameter of the flange portion 71a are formed in the light source element holder 82, so that the lead wire terminals 71c of the excitation light sources 71 are inserted through the lead wire outlet hole portions 82g so formed. Then, the flange portions 71a of the excitation light sources 71 are placed on the flat front surface of the light source element holder 82, whereby the flange portions 71a of the excitation light sources 71 are pressed against by the depressed portions which are formed in the collimator lens holder 79.

Thus, as has been described heretofore, according to the embodiment of the invention, the excitation light shining device 70 has the excitation light sources 71 which are the laser light emitting elements each including the cylinder portion 71b, the flange portion 71a which projects outwards of the cylinder portion 71b from the circumferential edge of the rear end of the cylinder portion 71b and the lead wire terminals 71c which extend from the rear end face of the flange portion 71a, the collimator lenses 73 each of which makes light emitted individually from the laser light emitting elements into a parallel light, the collimator lens holder 79 which includes the lens mounting depressed portions 79a which hold the collimator lenses 73 and the hole portions 79d that communicate with the lens mounting depressed portions 79a and which accommodate the cylinder portions 71b of the excitation light sources 71, and the light source element holder 82 that holds the excitation light sources 71 in the predetermined positions on the front surface thereof and has the lead wire outlet hole portions 82g that accommodate the lead wire terminals 71c of the excitation light sources 71 so held and which penetrate the light source element holder 82 from the front surface to the rear surface. Then, the front surfaces of the flange portions 71a of the excitation light sources 71 are fastened by the perimeters of the rear ends of the hole portions 79d in the collimator lens holder 79 so as to press the excitation light sources 71 against the front surface of the light source element holder 82 to thereby fix the excitation light sources 71 to the light source element holder 82. Then, the adhesion fixing members 92a are filled in the lead wire outlet hole portions 82g, whereby the excitation light sources 71 are adhesion fixed to the light source element holder 82.

Namely, the excitation light sources 71 which are the laser light emitting elements are adhesion fixed to the light source element holder 82 by the adhesion fixing member 92a. Consequently, it is possible to provide the light source device which is the excitation light shining device 70 that can prevent the removal of the excitation light sources 71 for use for other applications even when the collimator lens holder 79 and the light source element holder 82 are disassembled from each other and the projector 10 in which the light source device is mounted.

In the embodiment, the excitation light shining device 70 has been described which has the light emitting diodes which emit individually light of red wavelength band and light of blue wavelength band and the laser light emitting elements which excites the luminescent material which emits green luminescent light. However, the light source device of the embodiment which now employs red or blue laser light emitting elements can also be equally applied to, for example, the red light source device which emits light of red wavelength band or the blue light source device which emits light of blue wavelength band. As this occurs, when the related laser light emitting elements are fixed in the light source element holder 82, the removal of the laser light emitting elements can be made difficult by filling the adhesion fixing member 92a in the lead wire outlet hole portions 82g.

In addition, according to the embodiment of the invention, the lead wire outlet hole portion 82g is formed larger in diameter at the rear surface side of the light source element holder 82 than that at the front surface side thereof. Then, the adhesive 92 is applied to be filled in this lead wire outlet hole portion 82g and is then set to form the adhesion fixing member 92a having the conical frustum shape. Consequently, it becomes difficult to remove the excitation light source 71 in the light emitting direction thereof. Additionally, since the flange portion 71a of the excitation light source 71 is mounted in the mounting depressed portion 82c, it becomes difficult to remove the excitation light source 71 in an opposite direction to the light emitting direction.

Additionally, according to the embodiment of the invention, since the rear surface side of the lead wire outlet hole portion 82g is formed larger than the front surface side thereof in the tapered fashion, the adhesive 92 is applied to be filled in this lead wire outlet hole portion 82g and is then set to thereby form easily the adhesion fixing member 92a having the conical frustum shape. Because of this, it becomes difficult to remove the excitation light source 71 in the light emitting direction thereof.

Further, according to the embodiment of the invention, when the spiral groove portions are provided on the side surface of the lead wire outlet port portion 82g, the adhesion fixing member 92a comes to have the projecting portions 92k which are formed by the adhesive 92 that is filled in the groove portions of the lead wire outlet hole portion 82g. Namely, the adhesive force acting between the lead wire outlet hole portion 82g and the adhesion fixing member 92a is enhanced.

Additionally, according to the embodiment of the invention, by forming the minute irregularities on the side surface of the lead wire outlet hole portion 82g, the minute irregularities are formed on the surface of the adhesion fixing member 92a by the adhesive 92 that is filled in the minute irregularities of the lead wire outlet hole portion 82g and is then set. Namely, the adhesive force acting between the lead wire outlet hole portion 82g and the adhesion fixing member 92a is enhanced by the anchor effect.

Further, according to the embodiment of the invention, when the ultraviolet ray setting resin is adopted as the adhesion fixing member 92a, by shining an ultraviolet ray on to the ultraviolet ray setting resin after it has been applied to be filled in the lead wire outlet hole portion 82g, the adhesion fixing member 92a having the conical frustum shape can be formed within a short period of time.

Additionally, according to the embodiment of the invention, the adhesion fixing member 92a is filled in the lead wire outlet hole portion 82g so as to be closely attached to the rear end face of the excitation light source 71 which is the laser light emitting element. Because of this, for example, in the event that a tensile force is applied to the excitation light source in the light emitting direction, not only is a force generated in the opposite direction to the light emitting direction on the rear end face, but also a force is generated in the opposite direction to the light emitting direction in the lead wire terminals 71c. Because of this, a threshold of a tensile force that is required to remove the excitation light source 71 in the light emitting direction can be increased further. For example, when the excitation light source 71 is removed in the light emitting direction with an excessive force, as shown in FIG. 9, a situation occurs in which the lead wire terminals 71c are cut off the excitation light source 71. It becomes difficult to use the excitation light source 71 from which the lead wire terminals 71c are cut off for other applications. Namely, it is possible to provide the light source device which can prevent the removal of the excitation light source 71 for use for other applications.

Further, according to the embodiment of the invention, in the excitation light shining device 70, the element bearing depressed portions 82c are provided in the front surface of the light source element holder 82 so that the axes thereof are aligned with the axes of the corresponding lead wire outlet hole portions 82g. Then, the adhesion fixing members 92a are adhesion fixed in place at the rear surface side of the excitation light sources 71 in such a state that the flange portions 71a of the excitation light sources 71 are fitted in the element bearing depressed portions 82c, and the rear ends of the flange portions 71a of the excitation light sources 71 are fitted in the element bearing depressed portions 82c. Consequently, it is possible to provide the light source device that makes it difficult for the excitation light sources 71 to be removed and which can enhance the heat conductivity as a result of the contact area between the flange portions 71a and the light source element holder 82 being increased.

In addition, according to the embodiment of the invention, in the excitation light shining device 70, since the heat conductive grease is interposed in the contact portion between the excitation light sources 71 which are the laser light emitting elements and the light source element holder 82 as the heat conductive members 91, the heat conductivity from the excitation light sources 71 to the light source element holder is enhanced. Namely, it is possible to provide the excitation light shining device 70 having the good heat dissipating performance.

Further, according to the embodiment of the invention, the heat conductive grease is interposed as the heat conductive members 91 on the rear end faces of the excitation light sources 71 which are the laser light emitting elements and between the outer circumferences of the flange portions 71a and inner surfaces of the element bearing depressed portions 82c of the light source element holder 82. Consequently, the heat conductivity from the excitation light sources 71 to the light source element holder 82 is enhanced further. Additionally, when fabricating the light source device, the adhesive 92 is applied to be filled in the lead wire outlet hole portions 82g in the light source element holder 82 after the heat conductive members 91 are applied between the flange portions 71a and the element bearing depressed portions 82c in advance. Consequently, the adhesive 92 can be prevented from moving into gaps defined between the flange portions 71a and the element bearing depressed portions 82c to be set therein, and the reduction in heat conductivity between the flange portions 71a and the element bearing depressed portions 82c can also be prevented.

The light source element holder 82 has the flexible circuit board accommodating portion 82m which is formed at the rear of the lead wire outlet hole portions 82g. Then, the flexible circuit board 95 and the lead wire terminals 71c of the excitation light sources 71 which are the laser light emitting elements are connected together in the flexible circuit board accommodating portion 82m, and the adhesive 92 is not filled in the flexible circuit board accommodating portion 82m. Consequently, the flexible circuit board 95 can easily be connected to the lead wire terminals 71c of the excitation light sources 71.

Further, according to the embodiment of the invention, the projector 10 has the light source device, the display element 51 that forms an optical image with light that is emitted from the light source device, the light source side optical system 170 that guides light from the light source device to the display element 51, the projection side optical system 220 that projects the image that is emitted from the display element 51 on to the screen, and the control unit 38 that is the projector control unit for controlling the light source device and the display element 51. Then, the light source device is the light source device for at least one of the red light source device 120 that emits light of red wavelength band, the blue light source device 300 that emits light of blue wavelength band and the excitation light shining device 70 of the light source device which emits light of green wavelength band. Because of this, it is possible to provide, by utilizing the simple construction, the projector 10 which can prevent the removal of the excitation light sources 71 of the excitation light shining device 70 that is the light source device within the projector casing of the projector 10 for use for other applications once the light source device or the projector 10 can pass a total inspection.

In addition, according to the embodiment of the invention, the excitation light sources 71 which are the laser light emitting elements are placed at the front surface of the light source element holder 82 by inserting the lead wire terminals 71c through the lead wire outlet hole portions 82g in the light source element holder 82. Then, the collimator lens holder 79 is aligned with the light source element holder 82 with the hole portions 79d of the collimator lens holder 79 aligned with the positions of the laser light emitting elements, and the collimator lens holder 79 and the light source element holder 82 are fixedly joined together. Thereafter, the adhesive 92 is filled in the lead wire outlet hole portions 82g with the rear surface of the light source element holder 82 oriented upwards for formation of the adhesion fixing members 92a. Consequently, it is possible to provide easily the fabrication method of the light source device which can prevent the removal of the laser light emitting elements for use for other applications.

Further, according to the embodiment of the invention, the ultraviolet ray setting resin is used as the adhesive 92 for formation of the adhesion fixing members 92a. Then, the ultraviolet ray setting resin is injected into the lead wire outlet hole portions 82g, and an ultraviolet ray is shone on to the ultraviolet ray setting resin in such a state that the ultraviolet ray setting resin is brought into contact with the rear end faces of the excitation light sources 71 which are the laser light emitting elements in an ensured fashion, the ultraviolet ray setting resin then being set. Consequently, it is possible to easily form the adhesion fixing members 92a having the shape described above within a short period of time.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A light source device comprising:
   a laser light emitting element comprising a cylinder portion, a flange portion that projects outwards of the cylinder portion from a circumferential edge of a rear end of the cylinder portion, and lead wire terminals that extend from a rear end face of the flange portion;
   a collimator lens that makes light emitted from the laser light emitting element into parallel light;
   a collimator lens holder comprising a lens mounting depressed portion that holds the collimator lens and a hole portion that communicates with the lens mounting depressed portion and which accommodates therein the cylinder portion; and
   a light source element holder that holds the laser light emitting element in a predetermined position on a front surface thereof and which includes a lead wire outlet hole portion that accommodates the lead wire terminals and which penetrates the light source element holder from the front surface thereof to a rear surface thereof,
   wherein a front surface of the flange portion is fastened by the perimeter of a rear end of the hole portion so as to press the laser light emitting element against the front surface of the light source element holder to thereby fix the laser light emitting element to the light source element holder,
   wherein an adhesion fixing member is filled in the lead wire outlet hole portion so that the laser light emitting element is adhesively fixed to the light source element holder,
   wherein the lead wire outlet hole portion is formed larger in diameter at a rear surface side thereof than that at a front surface side thereof, and
   wherein the laser light emitting element and the adhesion fixing member which is filled in the lead wire outlet hole portion are adhesively fixed.

2. The light source device as set forth in claim 1, wherein the lead wire outlet hole portion is formed in a tapered fashion so that the lead wire outlet hole portion is larger in diameter at the rear surface side thereof than that at the front surface side thereof.

3. The light source device as set forth in claim 1, wherein the lead wire outlet hole portion has a step portion on a side surface thereof.

4. The light source device as set forth in claim 1, wherein the lead wire outlet hole portion has a spiral groove portion on a side surface thereof.

5. The light source device as set forth in claim 1, wherein the lead wire outlet hole portion has irregularities that are formed on a side surface thereof.

6. The light source device as set forth in claim 1, wherein the adhesion fixing member is an ultraviolet ray setting resin.

7. The light source device as set forth in claim 1, wherein the adhesion fixing member is filled in the lead wire outlet hole portion so as to be attached to a rear end face of the laser light emitting element.

8. The light source device as set forth in claim 1, wherein the light source element holder has an element bearing depressed portion that is formed so that an axis thereof is aligned with an axis of the lead wire outlet hole portion.

9. The light source device as set forth in claim 1, wherein a heat conductive member is interposed in a contact portion defined between the laser light emitting element and the light source element holder.

10. The light source device as set forth in claim 8, wherein a heat conductive member is interposed between (i) a rear end face of the laser light emitting element and an outer circumference of the flange portion and (ii) an inner surface of the element bearing depressed portion of the light source element holder.

11. The light source device as set forth in claim 1, wherein the light source element holder has a flexible circuit board accommodating portion that is formed at a rear of the lead wire outlet hole portion,
   wherein a flexible circuit board and the lead wire terminals of the laser light emitting element are connected together in the flexible circuit board accommodating portion, and
   wherein the adhesion fixing member is not filled in the flexible circuit board accommodating portion.

12. A projector comprising:
   light source devices;
   a display element;
   a light source side optical system that guides light from the light source devices to the display element;
   a projection side optical system that projects an image that is emitted from the display element on to a screen; and
   a projector control unit for controlling the light source devices and the display element,
   wherein the light source devices are a light source device that emits light of red wavelength band, a light source device that emits light of blue wavelength band and a light source device that emits light of green wavelength band, at least one of the light source devices being the light source device set forth in claim 1.

13. A projector comprising:
   light source devices;
   a display element;
   a light source side optical system that guides light from the light source devices to the display element;
   a projection side optical system that projects an image that is emitted from the display element on to a screen; and
   a projector control unit for controlling the light source devices and the display element, wherein the light source devices are a light source device that emits light of red wavelength band, a light source device that emits light of blue wavelength band and a light source device that emits light of green wavelength band, at least one of the light source devices being the light source device set forth in claim 2.

14. A projector comprising:
light source devices;
a display element;
a light source side optical system that guides light from the light source devices to the display element;
a projection side optical system that projects an image that is emitted from the display element on to a screen; and
a projector control unit for controlling the light source devices and the display element,
wherein the light source devices are a light source device that emits light of red wavelength band, a light source device that emits light of blue wavelength band and a light source device that emits light of green wavelength band, at least one of the light source devices being the light source device set forth in claim 3.

15. A projector comprising:
light source devices;
a display element;
a light source side optical system that guides light from the light source devices to the display element;
a projection side optical system that projects an image that is emitted from the display element on to a screen; and
a projector control unit for controlling the light source devices and the display element,
wherein the light source devices are a light source device that emits light of red wavelength band, a light source device that emits light of blue wavelength band and a light source device that emits light of green wavelength band, at least one of the light source devices being the light source device set forth in claim 5.

16. A projector comprising:
light source devices;
a display element;
a light source side optical system that guides light from the light source devices to the display element;
a projection side optical system that projects an image that is emitted from the display element on to a screen; and
a projector control unit for controlling the light source devices and the display element,
wherein the light source devices are a light source device that emits light of red wavelength band, a light source device that emits light of blue wavelength band and a light source device that emits light of green wavelength band, at least one of the light source devices being the light source device set forth in claim 7.

17. A fabrication method of a light source device, the light source device comprising:
a laser light emitting element comprising a cylinder portion, a flange portion that projects outwards of the cylinder portion from a circumferential edge of a rear end of the cylinder portion, and lead wire terminals that extend from a rear end face of the flange portion;
a collimator lens that makes light emitted from the laser light emitting element into parallel light;
a collimator lens holder including a lens mounting depressed portion that holds the collimator lens and a hole portion that communicates with the lens mounting depressed portion and which accommodates therein the cylinder portion of the laser light emitting element; and
a light source element holder including a lead wire outlet hole portion that accommodates the lead wire terminals of the laser light emitting element and which penetrates the light source element holder from the front surface thereof to a rear surface thereof,
wherein a front surface of the flange portion of the laser light emitting element is fastened by the perimeter of a rear end of the hole portion in the collimator lens holder so as to press the laser light emitting element against the front surface of the light source element holder to thereby fix the laser light emitting element to the light source element holder, and wherein an adhesion fixing member is filled in the lead wire outlet hole portion so that the laser light emitting element is adhesively fixed to the light source element holder, and
the fabrication method comprising:
placing the laser light emitting element at the front surface of the light source element holder by inserting the lead wire terminals through the lead wire outlet hole portion of the light source element holder;
aligning the collimator lens holder with the light source element holder with the hole portion of the collimator lens holder aligned with the position of the laser light emitting element and fixedly joining the collimator lens holder and the light source element holder together; and thereafter;
filling the adhesion fixing member in the lead wire outlet hole portion with the rear surface of the light source element holder oriented upwards, thereby adhesively fixing the laser light emitting element and the adhesion fixing member which is filled in the lead wire outlet hole portion, the lead wire outlet hold portion being formed larger in diameter at a rear surface side thereof than that at a front surface side thereof.

18. The light source device fabrication method as set forth in claim 17, wherein an ultraviolet ray setting resin is used as the adhesion fixing member, the ultraviolet ray setting resin is injected into the lead wire outlet hole portion, and an ultraviolet ray is shone on to the ultraviolet ray setting resin in such a state that the ultraviolet ray setting resin is brought into contact with a rear end face of the laser light emitting element in an ensured fashion so as to cause the ultraviolet ray setting resin to set.

* * * * *

UNITED STATES PATENT AND TRADEMARK OFFICE
CERTIFICATE OF CORRECTION

PATENT NO. : 9,477,145 B2  
APPLICATION NO. : 13/623339  
DATED : October 25, 2016  
INVENTOR(S) : Tomio Higo Page 1 of 1

It is certified that error appears in the above-identified patent and that said Letters Patent is hereby corrected as shown below:

In the Claims

Column 20, Line 35, after "thereafter" delete ";".

Column 20, Line 41, change "hold" to --hole--.

Signed and Sealed this
Third Day of January, 2017

Michelle K. Lee
*Director of the United States Patent and Trademark Office*